(12) United States Patent
Bednorz et al.

(10) Patent No.: US 6,990,008 B2
(45) Date of Patent: Jan. 24, 2006

(54) SWITCHABLE CAPACITANCE AND NONVOLATILE MEMORY DEVICE USING THE SAME

(75) Inventors: Georg J. Bednorz, Wolfhausen (CH);
David J. Gundlach, Adliswil (CH);
Gerhard I. Meijer, Zurich (CH);
Walter H. Riess, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/985,093

(22) Filed: Nov. 10, 2004

(65) Prior Publication Data

US 2005/0111256 A1  May 26, 2005

(30) Foreign Application Priority Data

Nov. 26, 2003  (EP)  ................................ 03405844

(51) Int. Cl.
*G11C 11/24*  (2006.01)
(52) U.S. Cl. ...................... 365/149; 365/168; 365/145; 257/298; 257/310; 257/312
(58) Field of Classification Search ................ 365/149, 365/150, 168, 145; 257/298, 310, 312
See application file for complete search history.

(56) References Cited

U.S. PATENT DOCUMENTS

| 4,849,852 A | * | 7/1989 | Mullins ...................... 361/288 |
| 5,448,098 A | | 9/1995 | Shinohara et al. .......... 257/441 |
| 6,195,047 B1 | * | 2/2001 | Richards .............. 343/700 MS |
| 6,204,139 B1 | | 3/2001 | Liu et al. ..................... 438/385 |
| 6,531,371 B2 | | 3/2003 | Hsu et al. ................... 438/385 |
| 2003/0156445 A1 | | 8/2003 | Zhuang et al. .............. 365/148 |
| 2005/0111256 A1 | * | 5/2005 | Bednorz et al. ............ 365/177 |

FOREIGN PATENT DOCUMENTS

WO   WO 00/49659   8/2000

OTHER PUBLICATIONS

A. Beck et al., "Reproducible Switching Effect in Thin Oxide Films for Memory Applications," Applied Physics Letters, vol. 77, No. 1, pp. 139-141, Jul. 2000.
Y. Watanabe et al., "Current-Driven Insulator-Conductor Transition and Nonvolatile Memory in Chromium-Doped $SrTiO_3$ Single Crystals," Applied Physics Letters, vol. 78, No. 23, pp. 3738-3740, Jun. 2001.
C. Rossel et al., "Electrical Current Distribution Across a Metal-Insulator-Metal Structure During Bistable Switching," Journal of Applied Physics, vol. 90, No. 6, pp. 2892-2898, Sep. 2001.
K. Ueno et al., "Field-Effect Transistor on $SrTiO_3$ with Sputtered $Al_2O_3$ Gate Insulator," Applied Physics Letters, vol. 83, No. 9, pp. 1755-1757, Sep. 2003.

* cited by examiner

*Primary Examiner*—Andrew Q. Tran
(74) *Attorney, Agent, or Firm*—Satheesh K. Karra

(57) ABSTRACT

A device (2) with a switchable capacitance comprises a first and a second electrode (12, 20) facing each other, a dielectric layer (14) between a first and a second capacitor electrode (12, 20), and a switching member (18) between the second electrode (20) and the dielectric layer (14), the switching member (18) comprising a switching material reversibly switchable between a lower conductivity state and a higher conductivity state, each of the lower conductivity state and the higher conductivity state being persistent, wherein the capacitance of the device (2) depends on the conductivity state of the switching material.

11 Claims, 2 Drawing Sheets

SWITCHABLE CAPACITANCE AND NONVOLATILE MEMORY DEVICE USING THE SAME

BACKGROUND OF THE INVENTION

1. Field of the Invention

The present invention refers to a device with a capacitance that can be switched between at least two different values and to a non-volatile memory device using the same.

2. Description of the Related Art

For memory devices and for numerous other applications, bistable devices or circuits are used. For example, for storing one bit of information in a memory, a bistable device can be used which is switchable between (at least) two different and persistent states. When writing a logical "1" into the device, it is driven into one of the two persistant states and when writing a logical "0" or erasing the logical "1", the device is driven into the other of the two different states. Each of the states persists until a next step of writing information into the device or erasing information in the device proceeds. A huge number of such bistable devices arranged in one or more arrays may form an EEPROM (EEPROM stands for electrically erasable programmable read-only memory) as a separate memory device or as part of an even more complex device.

An example for such a bistable device is a capacitor with a ferroelectric layer between its electrodes. The ferroelectric layer shows hysteresis polarization. The application of an electrostatic field causes a polarization of the ferroelectric material which persists after switching off the electrostatic field. The persistent remanence-polarization is deleted or erased or even inverted by an electrostatic field of opposite sign and sufficient strength.

When the ferroelectric layer is arranged between a gate and a channel of a field effect transistor, the polarization state of the ferroelectric layer influences the number of charge carriers induced in the channel. When the ferroelectric layer is positioned between the electrodes of a capacitor, the polarization state influences the capacitance of the capacitor. In both devices, the polarization state of the ferroelectric layer is switched by applying sufficiently high voltages between the capacitor electrodes or the gate and the channel, respectively.

A further bistable device is a resistor with two (or more) reversibly switchable and persistent resistance-states. The resistor is made of a material with respective reversibly switchable and persistent conductivity states.

U.S. Pat. No. 5,448,098 describes a superconductive photoelectric device with a superconductive thin film between two electrodes, the superconductive thin film having a photo-conductive effect and converting from a normally conducting state to a superconductive state in response to light irradiation. This superconducting state can be persistent.

U.S. Pat. No. 6,204,139 describes a method for switching properties of perovskite materials used in thin film resistors. The properties, in particular the conductivity, are switched reversibly by short electrical pulses. Application of the method for non volatile memory units and sensors with changeable sensitivity is proposed.

U.S. Pat. No. 6,531,371 describes an electrically programmable resistance cross point memory. At cross points of bit lines and word lines, perovskite material acts as variable resistors, the resistance values of which can be changed reversibly and with hysteresis.

US 20030156445 A1 describes a method of changing the resistance of a perovskite metal oxide thin film device by means of a voltage pulse.

Other materials are described in the three articles and the international application publication mentioned subsequently.

The articles "Reproducible switching effect in thin oxide films for memory applications" (A. Beck et al., Applied Physics letters, Vol. 77, No. 1, July 2000), "Current-driven insulator-conductor transition and nonvolatile memory in chromium-doped $SrTiO_3$ single crystals" (Y. Watanabe et al., Applied Physics Letters, Vol. 78, No. 23, June 2001) and "Electrical current distribution across a metal-insulator-metal structure during bistable switching" (C. Rossel et al., Journal of applied Physics, Vol. 90, No. 6, September 2001) and the international application publication WO 00/49659 A1 describe materials and classes of materials with hysteretically switchable electro static resistance, and simple resistor devices made from these materials.

The above-mentioned devices provide switching speeds, power consumptions and manufacturing costs which are still unsatisfactory for many applications.

SUMMARY OF THE INVENTION

It is the object of the present invention to provide an improved device with a switchable capacitance, a memory device comprising the inventive device and an improved method of switching the capacitance of a capacitor.

The present invention relates to a device with a switchable capacitance. The device comprises a first and a second electrode facing each other, a dielectric layer between the first and the second electrode, and a switching member between the second electrode and the dielectric layer. The switching member comprises a switching material that is reversible switchable between a lower conductivity state and a higher conductivity state. Each of the conductivity states is persistent. The capacitance of the device depends on the conductivity state of the switching material.

According to another aspect of the present invention, a capacitor comprises the device with switchable capacitance.

Furthermore, the present invention relates to a memory device with a plurality of storage cells, each of the storage cells of the plurality of storage cells comprising a device according to the present invention.

Furthermore, the present invention relates to a method of switching a capacitance of a device comprising a dielectric layer between a first and a second electrode and a switching member between the second electrode and the dielectric layer, the capacitance of the device depending on a conductivity state of the switching member, and the method comprising a step of driving the switching member into a lower conductivity state or into a higher conductivity state, each of the conductivity states being persistent.

The switching member can comprise a layer parallel to the first electrode. Alternatively, the switching member can electrically and conductively connect one of the electrodes with an intermediate electrode arranged between the dielectric layer and one of the electrodes. According to a preferred embodiment, the switching member is switchable by applying an electrical field, electrical current, heat or light, and exhibits hysteresis.

The idea underlying the present invention is to change the effective dielectric thickness of a capacitor or, in other words, the effective distance between the capacitor electrodes. The present invention makes use of an active, or switching member or element, comprising a switching material reversibly switchable between (at least two different) persistent conductivity states. The switching material can be driven into one of (at least) two different conductivity states by applying an electrostatic field, electrical current, heat, or light. The change in conductivity of the switching member persists after turn-off of the applied bias, thermal source or illumination source, and can subsequently be reversed by applying a sufficiently large bias voltage of opposite polarity and/or proper thermal or optical stimulation. The switching layer material may be crystalline, polycrystalline or amorphous, have a thickness in the range of μm to nm, and be organic, inorganic, an organic-inorganic matrix or a composite or a combination of these. The device makes use of electrodes between which the switching material exhibiting a bistable conductivity change and an insulator is sandwiched.

For the device according to the present invention, the change in conductance of the switching member will give rise to measurable change in device capacitance and may offer faster switching speeds, lower power consumption, and potentially lower manufacturing costs than currently available devices using existing technologies.

BRIEF DESCRIPTION OF THE DRAWINGS

These and other objects and features of the present invention will become apparent from the following description taken in conjunction with the accompanying drawings, in which.

DESCRIPTION OF THE PREFERRED EMBODIMENTS

Figure 1:
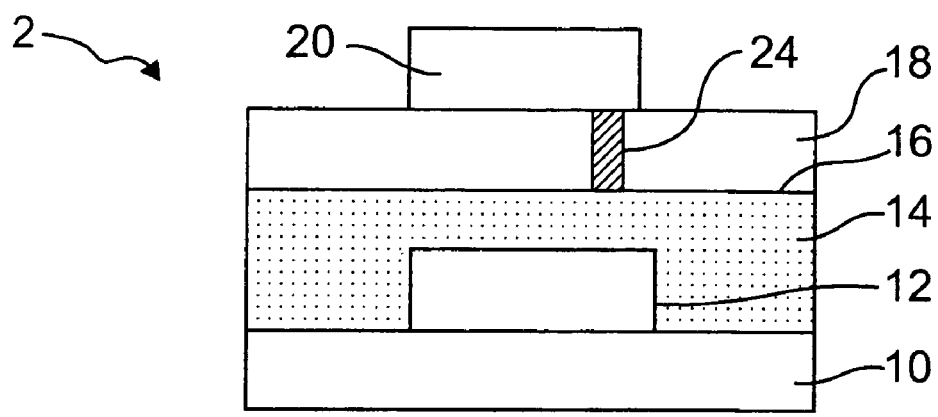
FIG. 1 is a schematic sectional view of a capacitor according to a first embodiment of the present application.

FIG. 1 is a schematic sectional view of a capacitor 2 according to a first preferred embodiment of the present invention. On a substrate 10, a stack-like arrangement of a first capacitor electrode 12, a dielectric layer 14, an intermediate layer 16, a switching member 18 and a second capacitor electrode 20 is formed. The first capacitor electrode 12 and the second capacitor electrode 20 are herein also referred to as first electrode 12 and second electrode 20, respectively. The first capacitor electrode 12 and the second capacitor electrode 20 and the intermediate electrode 16 between the capacitor electrodes 12, 20 are essentially in parallel to each other and separated from each other by the dielectric layer 14 and the switching member 18, respectively. The first capacitor electrode 12, the intermediate electrode 16 and the second capacitor electrode 20 at least partially overlap, and preferentially at least the capacitor electrode 12, 20 essentially completely overlap. This means in particular that the capacitor electrodes 12, 20 have essentially the same size and shape and symmetrically face each other. Preferentially the intermediate electrode 16 has the same shape and size as the capacitor electrodes or their overlap region or is even more extended in the lateral directions.

The switching member 18 comprises a switching material reversibly switchable between a lower conductivity state and a higher conductivity state. The lower conductivity state as well as the higher conductivity state are persistent, i.e. non-volatile.

Figure 2:
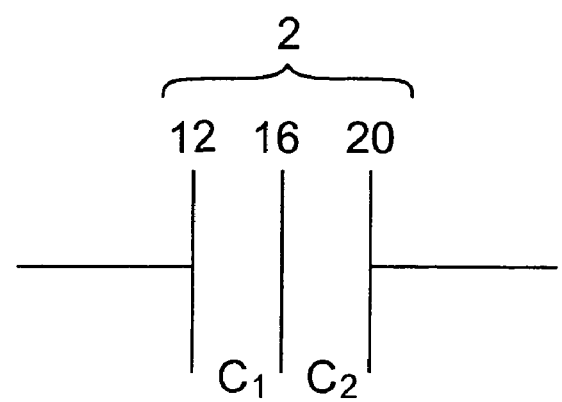
FIG. 2 is a schematic equivalent circuit diagram of the capacitor.
Figure 2:
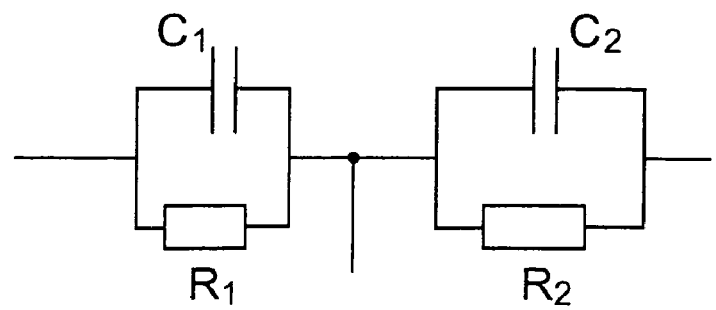

The basic principle underlying the present invention is demonstrated in FIG. 2. The capacitance of the capacitor 2 shown in FIG. 1 depends on the conductivity state of the switching member 18. This will subsequently be explained with reference to FIG. 2. FIG. 2 displays a schematic equivalent circuit diagram for the capacitor 2 described above. The capacitor 2 comprising the first capacitor electrode 12, the intermediate electrode 16 and the second capacitor electrode 20 is essentially a serial connection of two capacitors $C_1$, $C_2$, wherein the first capacitor electrode 12 and the intermediate electrode 16 form the capacitor $C_1$ and the intermediate electrode 16 and the second capacitor electrode 20 form the capacitor $C_2$.

The electrical resistance of the dielectric layer 14 is modelled by a resistor $R_1$, parallel to the capacitor $C_1$. The electric resistance of the switchable member 18 is modelled by a resistor $R_2$, parallel to the capacitor $C_2$.

The dielectric layer 14 is preferentially made of a nearly perfect dielectric material with very high resistance. Accordingly, the resistor $R_1$ provides a very high resistance and could alternatively be omitted in the equivalent circuit diagram.

When the switching material of the switching member 18 is in the lower conductivity state, the resistor $R_2$ provides a high resistance. In a first approximation, the resistor $R_2$ could be omitted. The equivalent circuit of the capacitor is rather a simple series connection of the capacitors $C_1$ and $C_2$. Therefore, in the lower conductivity state of the switching material of the switching member 18, the capacitance $C_{low}$ of the capacitor 2 can be expressed by:

$$C_{low} = \frac{1}{\frac{1}{C_1} + \frac{1}{C_2}} = \frac{A\varepsilon_0}{\frac{t_i}{\varepsilon_i} + \frac{t_s}{\varepsilon_s}},$$

wherein A is the (overlap) area of the capacitor electrodes 12, 20 and the intermediate electrode 16, $t_i$ is the thickness of the dielectric layer 14, $t_s$ is the thickness of the switching member 18, $\varepsilon_0$ is the vacuum permittivity or vacuum dielectric constant, and $\varepsilon_i$ and $\varepsilon_s$ are the relative permittivities of the dielectric layer 14 and the switching member 18, respectively.

In the higher conductivity state of the switching material of the switching member 18, the equivalent resistor $R_2$ provides a lower resistance. In a second approximation, the resistor $R_2$ could be replaced by a short circuit in the equivalent circuit diagram. Therefore, in the higher conductivity state, the capacitance $C_{high}$ of the capacitor 2 is approximately:

$$C_{high} = C_1 = \frac{A\varepsilon_0\varepsilon_i}{t_i}.$$

As can be seen from the formulas given for $C_{low}$ and $C_{high}$ given above, in the lower conductivity state of the switching material of the switching member 18, the capacitor 2 is approximately a capacitor with two dielectric layers between the capacitor electrodes, the first dielectric layer providing a thickness $t_i$ and a relative permittivity $\in_i$ and the second dielectric layer providing a thickness $t_s$ and a relative permittivity $\in_s$.

In the higher conductivity state of the switching material of the switching member 18, the capacitor 2 behaves like a capacitor with a single dielectric layer between the capacitor electrodes, the single dielectric layer providing a thickness $t_i$ and a relative permittivity $\in_i$. Therefore, switching the conductivity state of the switching material of the switching member 18 is like switching the effective thickness of the capacitor or the effective distance between the capacitor electrodes.

In the above discussion, the approximations $R_2$=infinity and $R_2$=0 were made for the lower conductivity state and the higher conductivity state, respectively, of the switching medium. Of course the quality of these approximations considerably depends on the actual values of the resistances of the switching material of the switching member 18, on the capacitances of the capacitors $C_1$, $C_2$, and on the frequency f, the capacitor 2 is operated with. Independent switching of the conductivity state of the switching material of the switching member 18 means switching the capacitance of the capacitor 2.

In preliminary tests with materials which will be described subsequently, the ratio of the resistances of the switching members in the higher conductivity state and the lower conductivity state, respectively, of the switching material ranged up to 1000 or even more, whereas a typical value was 100. With this ratio of the maximum and minimum values of the conductivity of the switching member 18, a ratio $C_{high}/C_{low}$ of the capacitance values of the capacitor 2 of at least 10 to 100 or even higher can easily be achieved.

A variety of materials can be used advantageously for the capacitor or its switching member 18, respectively. Good results have particularly been achieved with strontium titanate ($SrTiO_3$), doped with up to about 20% chromium (Cr).

In a preferred embodiment, the electrodes are formed on the switching member 18 made of Cr-doped $SrTiO_3$. When a sufficiently large bias voltage is applied to the electrodes to inject charge carriers in sufficient density or number into the switching material, a transition from a more resistive state (lower conductivity state) to a less resistive state (higher conductivity state) or reverse is induced, the direction of the transition depending on the polarity of the applied bias voltage.

The persistence of the effect, i.e. the time duration of the change in conductivity, depends on several factors including: device temperature, electrical fields applied to the switching material, density or number of injected charge carriers, and pulse length and sequence. This means that the persistence of the conductivity states can be influenced by heating the device, by application of a bias voltage to the switching material and by the density or number of charge carriers initially injected into the switching material. On the other hand, at least one conductivity state, namely the higher conductivity state, can be terminated at an arbitrary moment by applying a sufficient amount of heat or a sufficient voltage to the switching member 18.

When the switching material of the switching member 18 is Cr-doped $SrTiO_3$, it is preferred and advantageous to use undoped $SrTiO_3$ as the insulating dielectric material of the dielectric layer 14. When, other than shown in FIG. 1, the intermediate electrode 16 is omitted, the Cr-doped $SrTiO_3$ switching material can be epitaxially grown or deposited on top of the undoped $SrTiO_3$ dielectric layer 14.

Numerous other materials can be used as well, such as chalcogenide. Chalcogenide compounds-are compounds which comprise sulfur, selenium or tellurium.

Good results have been achieved in particular with $BaSrTiO_3$, $SrZrO_3$, $Ta_2O_5$, $Ca_2Nb_2O_7$ (Pr, Ca)$MnO_3$ and other materials with perovskite or perovskite-like crystal structure, each material doped preferentially with Cr, V or Mn. Further, the materials described in the above mentioned articles "Reproducible switching effect in thin oxide films for memory applications" (A. Beck et al., Applied Physics letters, Vol. 77, No. 1, July 2000), "Current-driven insulator-conductor transition and nonvolatile memory in chromium-doped $SrTiO_3$ single crystals" (Y. Watanabe et al., Applied Physics Letters, Vol. 78, No. 23, June 2001) and "Electrical current distribution across a metal-insulator-metal structure during bistable switching" (C. Rossel et al., Journal of applied Physics, Vol. 90, No. 6, September 2001) and in the international application publication WO 00/49659 A1 are advantageously usable in devices according to the present invention.

Again referring to FIG. 1, in the above-described first embodiment the switching member 18 is a layer of the switching material, whereby the layer extends laterally at least as far as the capacitor electrodes 12, 20 and whereby the thickness of the layer is essentially constant.

However, the change in conductivity of the switching material can be a bulk effect as well as an effect localized into parts of the switching material, for example to small filaments across the switching member, the filaments more or less connecting the second capacitor electrode 20 to the intermediate electrode 16. A filament between the second capacitor electrode 20 and the intermediate electrode 16 may for example look like a structure 24 shown in FIG. 1. The filament in which the switching of the conductivity states takes place may, however, comprise a more complex shape. Furthermore, several filaments may connect the second capacitor electrode 20 to the intermediate electrode 16 in parallel.

In the above-described embodiment and its variants, the switching member 18 is a laterally homogeneous and extended layer of the switching material. Alternatively, the switching member 18 comprises a laterally extended insulating or dielectric layer, and the switching material is arranged in the form of a filament, a wire, a rod or any other appropriate shape and connects the second capacitor electrode 20 and the intermediate electrode 16. For this embodiment, the structure 24 represents the switching material arrangement within a dielectric layer.

In the embodiment shown in FIG. 1, the switching between the conductivity states of the switching material of the switching member 18 is caused by applying a voltage between the capacitor electrodes 12, 20. Both switching the conductivity state of the switching member 18 and sensing the conductivity state, or the capacitance of the capacitor, take place via the same single pair of capacitor electrodes 12, 20.

Alternatively, the intermediate electrode 16 is used as a control electrode for controlling the conductivity state of the switching material of the switching member 18 by applying a voltage between the intermediate electrode 16 and the second capacitor electrode 20. In this case, the electrostatic field or the electric current applied to the switching member are essentially vertical to the planes of the capacitor electrodes.

Even more complex arrangements with one or more control electrodes arranged in a vertical stack together with the capacitor electrodes are possible and advantageous, too.

Further, the present invention generally includes arrangements of capacitor electrodes and one or more control electrodes with any angle included between the direction of electrical fields between the capacitor electrodes and the direction of the electrostatic field or the electrical current applied to the switching member for switching its conductivity state. For this purpose the control electrode or one or more control electrodes of a plurality of control electrodes, respectively, and the capacitor electrodes may be parallel or orthogonal with respect to each other or include any angle between 0° and 90°.

Figure 3:
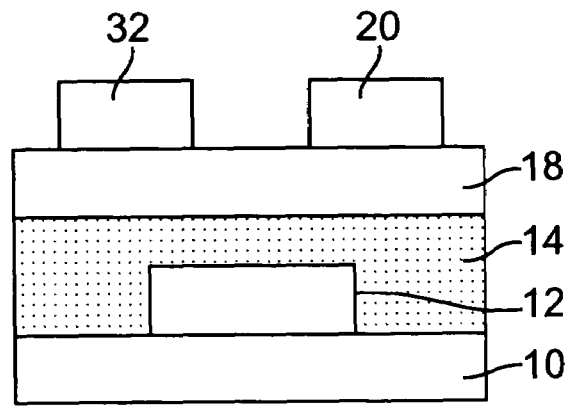
FIG. 3 is a schematic sectional view of a capacitor according to a second embodiment of the present invention.
Figure 4:
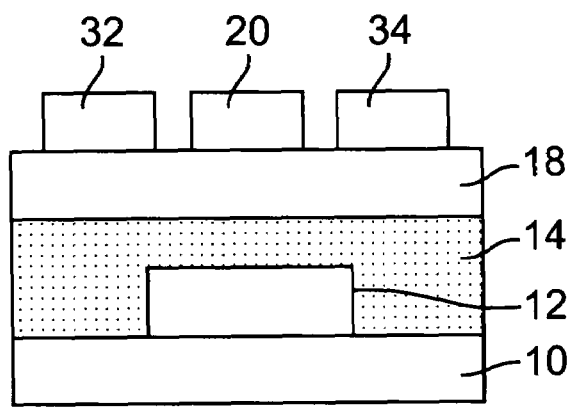
FIG. 4 is a schematic sectional view of a capacitor according to a third embodiment of the present invention.

FIGS. 3 and 4 display embodiments in which one or two additional control electrodes are used for switching the conductivity state of the switching member 18. In both embodiments shown in FIGS. 3 and 4, switching of the conductivity state of the switching material is caused by applying electrical fields essentially horizontal, or in parallel to the switching material layer of the switching member 18. For this reason preferentially no intermediate electrode 16 is provided and the whole switching member 18 is made of the switching material.

In the embodiment shown in FIG. 3, on top of the switching member 18, two electrodes are provided, namely the second capacitor electrode 20 and a control electrode 32. Both the second capacitor electrode 20 and the control electrode 32 are arranged essentially symmetrically. Therefore, the second capacitor electrode 20 and the control electrode 32 or at least their functionalities are interchangeable. Each of the electrodes 20, 32 can be used for applying an electrostatic field to the switching member for switching its conductivity state and for sensing the conductivity state by the measurement of the capacitance with reference to the first capacitor electrode 12.

FIG. 4 shows an embodiment with three electrodes on top of the switching member 18, namely the second capacitor electrode 20 and two control electrodes 32, 34. Although in this embodiment the functionality of the electrodes 20, 32, 34 is interchangeable as well, it is preferred and advantageous to use the control electrodes 32, 34 to apply a horizontal or lateral electrostatic field to the switching member 18 in order to switch its conductivity state and to use the second capacitor electrode 20 for sensing the conductivity state of the switching member 18 by a measurement of the capacitance between the capacitor electrodes 12, 20, facing each other.

For the above described application of a lateral electrostatic field to the switching member 18, a linear arrangement of the control electrodes 32, 34 and the second capacitor electrode 20 as shown in FIG. 4 is preferred and advantageous. In this arrangement both the control electrodes 32, 34 and the second capacitor electrode 20 are arranged directly on top of an essentially planar surface of the switching member 18 and the second capacitor electrode is arranged between the control electrodes 32, 34. In other words, the control electrodes 32, 34 are arranged next to two diametrically opposed sides of the second capacitor electrode 20.

Alternatively, even more complex electrode structures are arranged on top of the switching member 18, for example interdigital electrodes, one- or two-dimensional periodic gratings of electrodes, concentric arrangements of circular or frame-like electrodes or (at least two) spiral electrodes may be provided as second capacitor electrode 20 and control electrode 32, 34. Each of these electrodes can be used exclusively for either applying a switching voltage to the switching member 18 or for sensing the capacitance and the conductivity state of the switching member 18. Alternatively, one or more of the electrodes are used both for applying the switching electrostatic field and for sensing the conductivity state and the capacitance.

The above-described capacitor can be used for a broad variety of applications, for example as a sensor element or a programmable capacitor for use in applications requiring tuneable RC circuits or filters. A further application of the capacitor can be found in memories, in particular non-volatile memory devices like EEPROMs.

Figure 5:
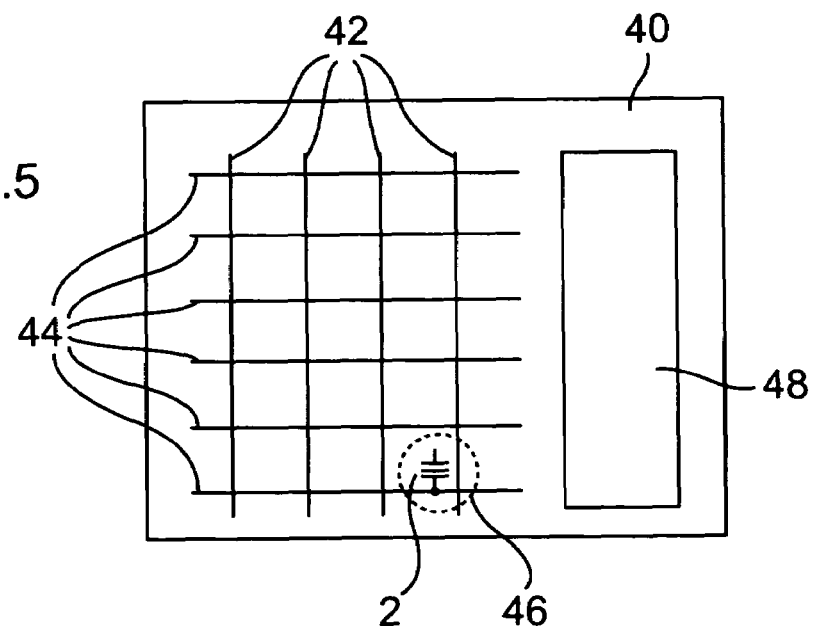
FIG. 5 is a schematic representation of a memory device according to an embodiment of the present invention.

FIG. 5 schematically displays a memory device 40. The memory device 40 comprises a plurality of storage cells arranged at cross points of word lines 42 and bit lines 44. Only one of the storage cells is displayed in FIG. 5 in a schematic and exemplary way and circumscribed by a dotted line 46. Like the exemplary storage cell 46, each of the plurality of storage cells comprises a capacitor 2 according to one of the above-described embodiments.

In the memory device 40 shown in FIG. 5 one bit of information can be stored in each storage cell, the lower conductivity state and the corresponding lower capacitance of the capacitor 2 being assigned to a logical "0" and the higher conductivity state and the corresponding higher capacitance of the capacitor 2 being assigned to a logical 1 or vice versa. Alternatively, more than two distinct conductivity states of the switching member 18 corresponding to and resulting in a respective number of different capacitance values can be used to store more than one bit of information in each storage cell 46.

Preferably, each storage cell 46 comprises not only a capacitor 2, but also one or several further members, for examples a transistor controlled via the corresponding word line 42. In this case, one of the plurality of storage cells 46 and capacitors 2 connected to one of the bit lines 44 can be selected for writing or reading by a signal on the corresponding word line 42.

Further parts of the memory device 40, for example multiplexers and demultiplexers, sense amplifiers and other circuits for writing, reading and other operations of the memory device 40 are subsumed schematically in a control circuit 48.

As an alternative to the electrical switching of the conductivity state of the switching material of the switching member 18, the same is done by applying heat or light, both of which may for example be applied by means of a laser beam of appropriate wavelength and intensity.

For all mechanisms of switching the conductivity state of the switching material of the switching member 18, it should be mentioned that the same shows hysteresis, i.e. even after the end of an application of an electrostatic field, electrical current, heat, or light etc., the conductivity state into which the switching material is driven at least partly remains for some time.

Preferably and most advantageously, the conductivity states persist for an infinite time ("forever"). Typically, the conductivity states persist for several years (at room temperature). Even if the conductivity states of the switching material of the switching member merely persist for days, hours or seconds and need to be refreshed like the storage cells in a DRAM device, the present invention is advantageous as the refresh period will still be much longer than in a conventional DRAM device.

What is claimed is:

1. A device with a switchable capacitance, the device comprising:
   a first electrode and a second electrode;
   a dielectric layer between the first electrode and the second electrode; and a switching member between the second electrode and the dielectric layer, the switching member comprising a switching material reversibly switchable between a first conductivity state and a second conductivity state, the first conductivity state having a conductivity which is lower than a conductivity of the second conductivity state, each of the first conductivity state and the second conductivity state being persistent, wherein the capacitance of the device varies as a function of the conductivity state of the switching material.

2. The device according to claim 1, wherein the switching member comprises a layer parallel to the second electrode.

3. The device according to claim 1, wherein the switching member electrically conductively connects the second electrode with an intermediate electrode placed between the second electrode and the dielectric layer.

4. The device according to claim 1, wherein the conductivity state of the switching material of the switching member is switchable by application of at least one of an electrostatic field, electrical current, heat, and light to the switching material, and wherein the conductivity state of the switching material exhibits hysteresis.

5. The device according to claim 1, wherein the conductivity state of the switching material is switchable by a switching voltage applied between the first and the second electrodes.

6. The device according to claim 1, further comprising:
a first control electrode,
wherein the conductivity state of the switching material is switchable by application of a switching voltage between the first control electrode and a second control electrode or between the first control electrode and one of the first and second electrodes.

7. The device according to claim 1, wherein the switching material comprises at least one compound from the group consisting of chalcogenide, $SrTiO_3$, $SrZrO_3$, $BaSrTiO_3$, $Ta_2O_5$, $Ca_2Nb_2O_7$, and a material comprising at least one of a perovskite and a perovskite-like crystal structure, the material being doped up to 20% with a dopant.

8. A capacitor comprising at least one device, the device comprising:
a first electrode and a second electrode;
a dielectric layer between the first and second electrodes; and
a switching member between the second electrode and the dielectric layer, the switching member comprising a switching material reversibly switchable between a first conductivity state and a second conductivity state, the first conductivity state having a conductivity which is lower than a conductivity of the second conductivity state, each of the first conductivity state and the second conductivity state being persistent, wherein the capacitance of the device varies as a function of the conductivity state of the switching material.

9. A memory device with including a plurality of storage cells, at least one of the storage cells comprising at least one device, the device comprising:
a first electrode and a second electrode;
a dielectric layer between the first and second electrodes; and
a switching member between the second electrode and the dielectric layer, the switching member comprising a switching material reversibly switchable between a first conductivity state and a second conductivity state, the first conductivity state having a conductivity which is lower than a conductivity of the second conductivity state, each of the first conductivity state and the second conductivity state being persistent, wherein the capacitance of the device varies as a function of the conductivity state of the switching material.

10. A method of switching a capacitance of a device comprising a dielectric layer between a first electrode and a second electrode, and a switching member between the second electrode and the dielectric layer (14), the switching member comprising a switching material reversibly switchable between a first conductivity state and a second conductivity state, the first conductivity state having a conductivity which is lower than a conductivity of the second conductivity state, the method comprising the step of:
driving the switching member into one of the first conductivity state and the second conductivity state, each of the conductivity states being persistent,
wherein the capacitance of the device varies as a function of the conductivity state of the switching member.

11. The device according to claim 7, wherein the dopant comprises at least one of Chromium (Cr), Vanadium (V), and Manganese (Mn).

* * * * *

UNITED STATES PATENT AND TRADEMARK OFFICE
CERTIFICATE OF CORRECTION

PATENT NO. : 6,990,008 B2  Page 1 of 1
DATED : January 24, 2006
INVENTOR(S) : G.J. Bednorz et al.

It is certified that error appears in the above-identified patent and that said Letters Patent is hereby corrected as shown below:

Column 10,
Line 9, delete "with".

Signed and Sealed this

Eleventh Day of April, 2006

JON W. DUDAS
*Director of the United States Patent and Trademark Office*